United States Patent [19]

Bernstein et al.

[11] Patent Number: 4,714,905
[45] Date of Patent: Dec. 22, 1987

[54] SMC FILTER AND METHOD OF MANUFACTURE THEREOF

[75] Inventors: Richard Bernstein, Oxford; William H. Anthony, Salisbury, both of Md.; David A. Lupfer, Cazenovia, N.Y.

[73] Assignee: K & L Microwave, Salisbury, Md.

[21] Appl. No.: 916,559

[22] Filed: Oct. 8, 1986

[51] Int. Cl.⁴ .................. H03H 3/00; H03H 7/01; H03H 7/075
[52] U.S. Cl. ............................ 333/167; 29/832; 333/168; 333/184; 333/185
[58] Field of Search .............. 333/12, 167, 181, 183, 333/184, 182, 185, 140, 168, 172, 174, 175, 176, 202, 204, 205; 361/424, 415, 399; 29/613, 832, 841

[56] References Cited

U.S. PATENT DOCUMENTS

| | | | |
|---|---|---|---|
| 4,266,206 | 5/1981 | Bedard et al. | 333/204 |
| 4,410,874 | 10/1983 | Scapple et al. | 29/613 X |
| 4,455,540 | 6/1984 | Henriot et al. | 333/202 |
| 4,581,795 | 4/1986 | Mobbs et al. | 333/172 X |

Primary Examiner—Marvin L. Nussbaum
Attorney, Agent, or Firm—Franklin D. Wolffe; Morris Fidelman

[57] ABSTRACT

A microwave bandpass filter for frequencies in the range of 30-3000 MHz comprises a substrate formed from dielectric ceramic sheets fused together and stacked according to a dielectric constant required of the filter capacitors, the plates of which are formed on the substrate. Discrete air core coils, to provide greater frequency selectivity in this particular frequency range, are attached into the circuit on a top surface of the substrate, and a drawn metal can covers the circuitry on the top surface and is soldered to a metallized coating extending over substantially all of the rest of the substrate except for surface mounting lead portions and associated conductive paths. Thus, EMI and RFI shielding is provided by the combination of the metal can and the ground plane of the circuit. The metal can portion of the shield also provides physical protection for the fragile air core coils, while presenting a solid, uniform profile for engagement by a pick and place head during subsequent handling of the finished component.

5 Claims, 8 Drawing Figures

SMC FILTER AND METHOD OF MANUFACTURE THEREOF

PRIOR ART CROSS REFERENCES

U.S. Pat. No. 3,029,495 - ELECTRICAL INTERCONNECTION OF MINIATURIZED MODULES, issued Apr. 17, 1962 to Doctor.

U.S. Pat. No. 3,398,326 - SOLID STATE ELECTRICAL COMPONENT COMBINING MULTIPLE CAPACITORS WITH OTHER KINDS OF IMPEDENCE, issued Aug. 20, 1968 to Swart, et al.

U.S. Pat. No. 3,701,958 - MULTISECTION BANDPASS FILTER FROM SMALL SIGNAL CIRCUITS, issued Oct. 31, 1972 to Jaag.

U.S. Pat. No. 4,110,715 - BROADBAND HIGH PASS MICROWAVE FILTER, issued Aug. 29, 1978 to Reindel.

U.S. Pat. No. 4,183,074 - MANUFACTURE OF MULTI-LAYERED ELECTRICAL ASSEMBLIES, issued Jan. 8, 1980 to Wallace.

U.S. Pat. No, 4,203,081 - PASSIVE CIRCUIT ELEMENT FOR INFLUENCING PULSES, issued May 13, 1980 to Braeckelmann.

U.S. Pat. No. 4,328,531 - THICK FILM MULTI-LAYER SUBSTRATE, issued May 4, 1982 to Nagashima, et al.

U.S. Pat. No. 4,342,143 - METHOD OF MAKING MULTIPLE ELECTRICAL COMPONENTS IN INTEGRATRED MICROMINIATURE FORM, issued Aug. 3, 1982 to Jennings.

U.S. Pat. No. 4,372,037 - LARGE AREA HYBRID MICROCIRCUIT ASSEMBLY, issued Feb. 8, 1983 to Scaple, et al.

U.S. Pat. No. 4,437,140 - PRINTED CIRCUIT DEVICE, issued Mar. 13, 1984 to Ohyama, et al.

U.S. Pat. No. 4,516,092 - LEADERLESS FILTER COMPONENT, issued May 7, 1985 to Rosenberg.

BACKGROUND OF THE INVENTION

The invention is directed to the field of surface mountable chips (SMC's), and more particularly to a series or family of SMC-type band pass filters for frequencies of 30-3000 MHz.

As opposed to components having leads to be "inserted" into holes of a circuit board, SMC's are "onserted" or placed on the circuit board with conductive portions on or near the bottoms of the chips situated for electrical connection by soldering or the like with circuit board tracks. Generally, these are microminiature components which are preferably handled automatically by a pick and place robotic hand or like.

There is an industry need for a series of SMC filters, particularly multisection bandpass filters for the 30-3000 MHz range, which are reliable and easily handled by automated pick and place heads; and it is an object of the invention to meet this need.

It is known to provide multiple thick film layers of conductors and insulators in order to fabricate SMC devices, but such a process doesn't lend itself to assembly of a monolithic substrate with a selected dielectric constant from vendor supplied sheets of material. Examplary of this prior art are U.S. Pat. Nos. 4,342,143; 4,328,531; 4,372,037; and 4,437,140, cross referenced above. "Pinholding", described later, is an additional manufacturing problem in these types of devices.

It is also known to provide SMC filter capacitors of multilayered ceramics, and U.S. Pat. No. 4,516,092 discloses such a capacitor with a discrete inductor attached thereto to complete a filter section. However, the device is particularly directed to a power supply filter and is not concerned with the EMI and RFI problems encountered by the field of the instant invention.

Additionally, it is an object of the invention to provide such a filter wherein plural sheets of suitable dielectric ceramic material are fused together to form a monolithic substrate providing an easily specifiable dielectric constant for the filter capacitors which are formed thereon, and where discrete air core coils provide improved selectivity in the range of 30-3000 MHz.

Further, it is an object of the invention to provide such SMC-type filters in which a ground plane thereof provides one plane of each filter capacitor of the circuit while also substantially enclosing the chip and being attached to a metal cover to provide electromagnetic interference (EMI) and radiofrequency interference (RFI) shielding for the circuit.

Still further, it is an object of the invention that the cover provide a surface by which the component is easily handled by a pick and place tool while also providing physical protection for the fragile air core coils.

These and other objects of the invention will become more apparent from the following detailed disclosure.

BRIEF SUMMARY OF THE INVENTION

A bandpass filter for frequencies in the range of 30-3000 MHz comprises a substrate formed from fused together suitable dielectric cermaic sheets stacked according to a dielectric thickness required of the filter capacitors, the plates of which are formed on the substrate. One or more substrates with various topography in the form of conductors or capacitor plates can be utilized.

Discrete air core coils, to provide greater resonator "Q" for the particular frequency range, are attached to a top surface of the substrate, and a drawn metal can covers the circuitry on the top surface and is soldered to a metallized coating extending over substantially all of the rest of the substrate exept for surface mounting lead portions and associated conductive paths. Thus, EMI and RFI shielding is provided by the combination of the metal can and the ground plane of the circuit. The metal can portion of the shield also provides physical protection for the fragile air core coils, while presenting a solid, uniform profile for engagement by a pick and place head during subsequent handling of the finished component.

BRIEF DESCRIPTION OF THE DRAWINGS

Metallic coating thicknesses are exaggerated in the drawings for purposes of illustration only.

DETAILED DESCRIPTION OF THE DRAWINGS

Figure 1:
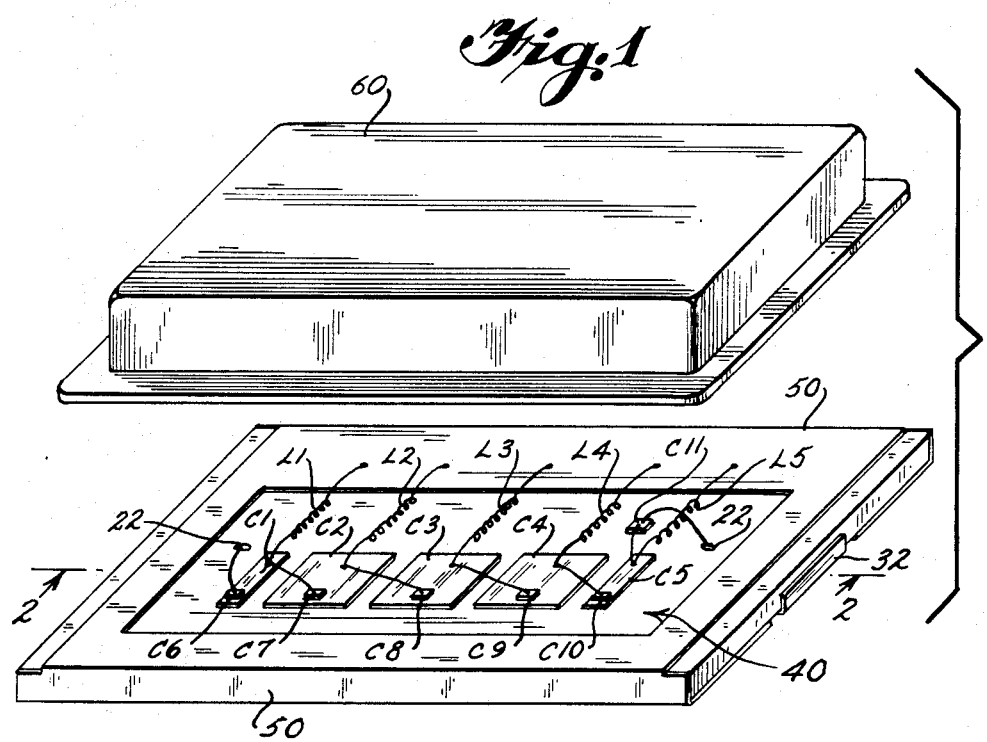
FIG. 1 is an isometric view of the surface mountabletype filter chip of the invention with the cover raised for better illustration.
Figure 2:
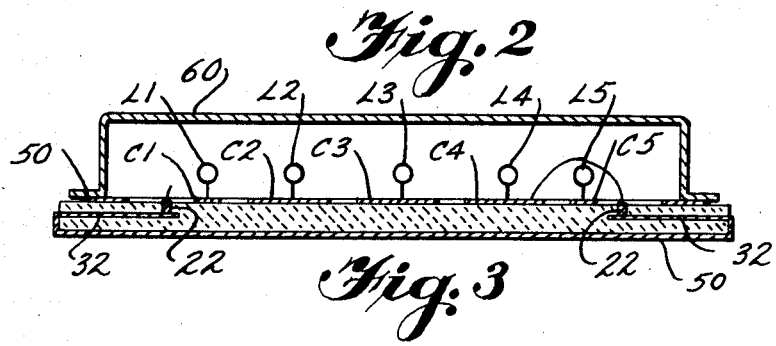
FIG. 2 is a cross-sectional view through the slip of FIG. 1, but with the cover attached.
Figure 3:
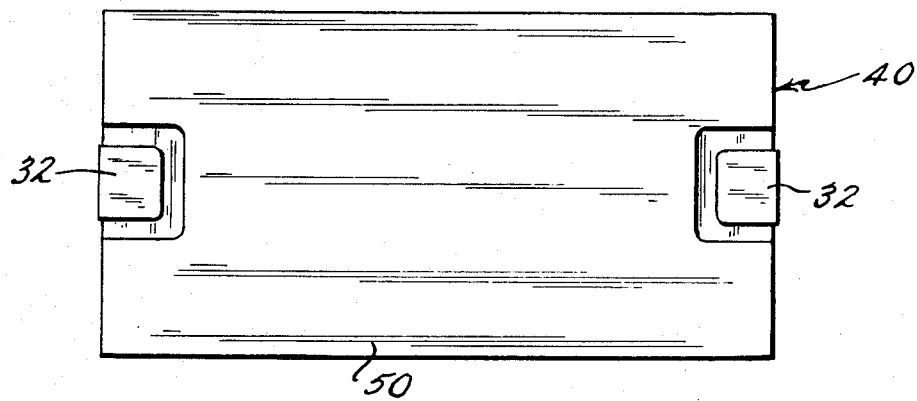
FIG. 3 is a bottom plan view of the device of FIG. 2.
Figure 4:
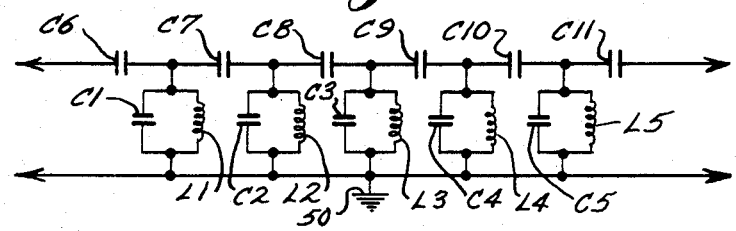
FIG. 4 is a schematic of the filter circuit of FIG. 1.
Figure 5:
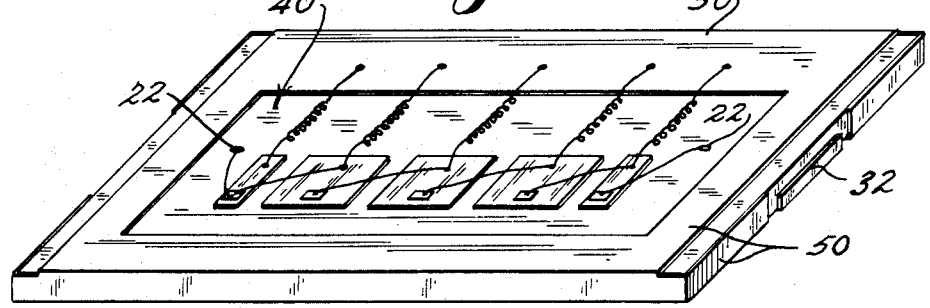
FIG. 5 is an isometric view of an alternate embodiment of the device of FIG. 1, with cover removed for illusration purposes, wherein the metallized ground plane coating extends over substantially all of the end edges.
Figure 6:
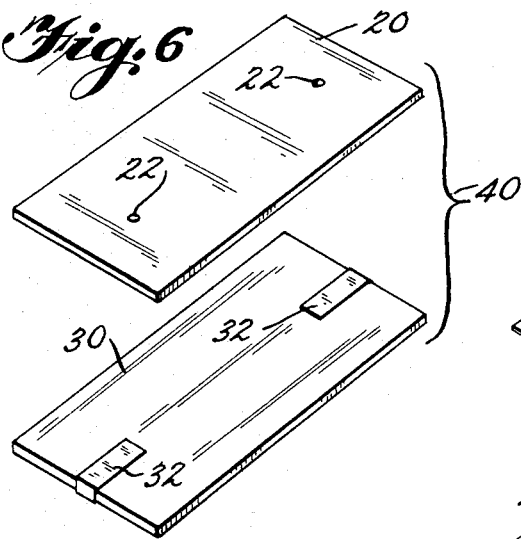
FIG. 6 is an exploded view of two suitable dielectric ceramic sheets prior to uniting them to form the unitary substrate of the filter.

Referring to the figures, two sheets 20, 30 of suitable dielectric ceramic material provide a substrate of a specifiable dielectric constant, with such dielectric constant being changeable by a composition of each sheet or an "adjustable" capacitance created by providing additional sheets of the same composition in the stack making up the substrate.

conductive lands are screened onto a portion of the top surface of the substrate to provide one plate for each of the capacitors $C_1$-$C_5$, with the other plate for each of the capacitors being the metallized ground plane screened onto the bottom surface of the substrate. Multiple plates on multiple substrates can be stacked to increase capacitance or provide specialized interconnection of circuits. As seen in the figures, the ground plane is extended around at least the side edges of the substrate and on to the top surface thereof to provide a border around and spaced from the conductive lands. Individual air core coils $L_1$-$L_5$ having the required filter characteristics are attached between the ground plane 50 and a corresponding conductive land. Discrete coupling capacitors $C_6$-$C_{11}$ may also be provided, along with a conductive path from the top surface of the substrate to the bottom surface of the substrate so as to provide a surface mountable chip. These conductive paths or vias may take several forms. As seen in FIG. 6, the substrate 40 comprises two layers of the ceramic material of which the top layer 20 has been drilled or punched or otherwise perforated to provide holes 22 which are filled with an electrically conductive material, and the bottom layer 30 has been screened with electrically conductive strips 32, each of which extend from a top surface of sheet 30 around an end edge and onto a bottom surface of sheet 30. Subsequent fusing of the two sheets together completes the conductive path from points on the top surface of substrate 40 to the bottom surface thereof.

Figure 7:
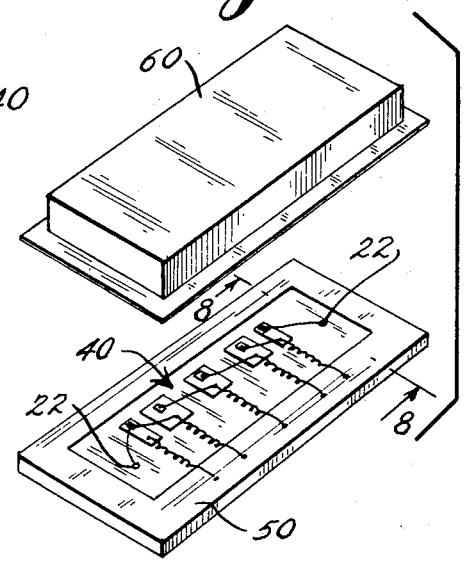
FIG. 7 is an alterante embodiment of the device of FIG. 1 wherein vias extend from top to bottom of the substrate without being on the edges of the device.
Figure 8:
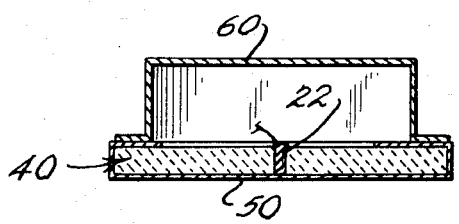
FIG. 8 is a sectional view of the assembled device of FIG. 7 and taken generally in the direction of arrows 8—8.

As seen in FIG. 7, the holes may extend directly from top to bottom through the substrate.

A drawn can cover 60, when attached to ground plane 50 as by soldering, completes an electromagnetic inteference (EMI) and radiofrequency interference (RFI) shield in combination with the ground plane coating. Cover 60 also provides a solid physical shield for the fragile air core coils $L_1$-$L_5$ while presenting a uniform profile adaptable to easy handling by a pick and place head utilized in subsequent handling of the finished component.

Having determined various parameters of the filter such as frequency, band width, and package size, sheets of suitable dielectric ceramic material may be selected in composition to provide the dielectric constant required, and in number and size to fulfill the capacitance requirements. For instance, with two sheets of such "suitable dielectric ceramic" material meeting the required dielectric value, the top sheet 20 (FIG. 6) may be punched or drilled with holes 22 and filled with a thick film conductive ink. Thereafter metallized strips 32 are screen printed onto bottom layer 30 and the two sheets are thermopressed to bond the ceramic sheets (in the green state) together.

Then, the laminated sheets are fired in a furnace sufficiently to sinter the ceramic and drive away all plasticizers used in the green state, while fusing the thick film conductive coatings to the ceramic material.

Thereafter, conductive lands, providing one plate of each capacitor $C_1$-$C_5$, are screened onto the top surface of the unitary substrate and a ground plane 50 is screened onto substantially all of the exposed surfaces of the substrate while leaving a small area for any exposed conductive vias and a small uncoated area around the lands. Air core coils $L_1$-$L_5$, selected according to the characteristics required of the filter and in order to provide a higher "Q" factor than printed inductors would provide, are attached between the lands and the ground plane to form a plurality of filter sections which are interconnectable into a multisection filter as by the provision of coupling capacitors $C_6$-$C_{11}$.

Finally, the drawn metallic can 60 is soldered to that portion of ground plane 50 which forms a border around the central portion of the substrate top surface, thus completing an EMI and RFI shield while providing a physical shield for the air core coils and a uniform profile for subsequent handling of the finished component by a pick and place head or the like.

Use of suitable dielectric ceramic sheets in construction of the substrate provides Q's in excess of two thousand, according to the frequecy requirements. For example, Dupont 9429 multilayered dielectric ceramic has a Q on the order of 400–1600, whereas multiple thick film layers used as a capacitive substrate historically have Q's less than 1000 and require a separate substrate as a support for the thick film layers. Further, a basic electrical problem with the multiple thick film layers is that the viscosity of the conductive ink is such as to cause pin holes upon during when only one coat is applied to a substrate, and this "pinholing" is critical to voltage breakdown of a capacitor. Thus, several layers must be applied with the consequent loss of time in waiting for the each layer to dry before applying the next layer.

The instant structure may be used to provide a series or family of band pass filters particularly adapted to the frequency range of 30–3000 MHz. In a prototype filter, the original design was for a five pole, 0.01 dB Chebyshev filter having a center frequency of 243 MHz, with a bandwidth of 25 MHz. Actual performance of the tuned prototype was at a center frequency of 273 MHz, with a bandwidth of 23 MHz. The measured data of this prototype included 3.3 dB loss points of 264.5 MHz and 286.5 MHz and a return loss of 14 dB minimum at 263.5 MHz through 284.0 MHz and a bandwidth of 20.5 MHz. The coils were fifteen turns of No. 32 formula and a 0.052 internal diameter. This prototype was approximately 0.50 inches wide, 1.00 inches long and 0.20 inches thick, with the cover attached, and sizes as small as 0.25 wide×0.50 long×0.10 high are contemplated.

Among the objects made apparent from the preceding description, certain changes may be made in carrying out the above method and in the construction set forth without departing from the scope of the invention, and it is intended that all matter contained in the above description or shown in the accompanying drawings shall be interpreted as illustrative and not in a limiting sense. For instance, various types of filters, such as bandpass, band reject, high pass, and low pass are contemplated to be within the context of the invention.

It is also to be understood that the following claims are intended to cover all of the generic and specific features of the invention herein described and all statements of the scope of the invention which, as a matter of language, might be said to fall therebetween.

We claim:

1. A method of manufacturing a surface mount-type chip filter circuit for passing frequencies in a specified range generally greater than 30 MHz, and comprising the steps of:

determining a dielectric constant required for filter capacitors of said circuit and corresponding to said specified range;

providing at least two sheets of suitable dielectric green state ceramic which, when stacked and fused together, provide said dielectric constant, each of said sheets being generally rectangular in shape and having a top and a bottom surface connected by end and side edges;

providing holes through at least a top one of said sheets and filling said holes with an electrically conductive material to provide vias;

screening electrically conductive strips onto one of said sheets so as to prepare a bottom sheet for said stack, with each of said strips extending from said top surface of said bottom sheet and around an end edge and onto said bottom surface of said bottom sheet, and each strip being situated for connection to a corresponding one of said vias upon stacking of said sheets;

stacking and laminating said sheets together;

firing said sheets in a kiln sufficiently to center said ceramic and fuse said sheets together into a unitary module having said vias interconnected with said strips conductively to form thin conductive paths from a top area of said module to surface mounting lead portions on a bottom area of said module;

screening a metallized conductive layer over substantially all surface areas of said module, except for a center portion of said module top area and exposed portions of said conductive paths, and thus providing a ground plane for said filter circuit and a unitary second plate for each of said filter capacitors and a portion of an electromagnetic and radiofrequency interference shield for said filter circuit;

screening small conductve lands onto said central portion and separate from said ground plane and thus providing a corresonding individual first plate for each said filter capacitor;

attaching discrete air core inductors, commensurate with characteristics of said filter circuit, between said ground plane and corresponding ones of said first plates and thus providing a plurality of filter sections;

providing interconnection of said filter sections and said vias in order to complete said filter circuit with input and output paths from said filter circuit to said surface mounting lead portions on said module bottom area; and attaching a metallic can to said ground plane spaced from and covering said inductors, thus completing said shield for said circuit while providing a physical shield for said inductors and providing a uniform profile adapted for subsequent handling of said chip.

2. The method as in claim 1, and further comprising the step of:

attaching discrete coupling capacitors between said filter sections.

3. In a method of manufacturing a surface mount chip-type filter circuit having conductive lands screened onto a dielectric substrate as first plate of filter capacitors, and discrete air core inductors attached thereto for said filter, the improvement comprising the steps of:

applying a metallic coating on substantially all surface areas of said substrate, except for a central top portion of said substrate containing said lands and exposed portions of vias from said centeral top portion to surface mounting lead portions on a bottom of said substrate, thus providing a second plate for said capacitors and a ground plane for said circuit and a portion of an EMI and RFI shield for said circuit; and completing said EMI and RFI shield, while providing a physical shield for said inductors and a solid, uniform profile adapted for subsequent handling by a pick and place component handling head, by attaching a formed metallic cover to said ground plane and spaced from and covering said inductors and lands.

4. A filter circuit for passing frequencies in a specified range generally greater than 30 MHz, and comprising:

at least two sheets of suitable dielectric green state ceramic stacked and fused together to provide a unitary substrate with a dielectric constant required for filter capacitors of said circuit corresponding to said specified range, said substrate being generally rectangular in shape and having top and bottom areas connected by end and side edges;

vias comprising holes through at least a top one of said sheets and filled with an electrically conductive material;

electrically conductive strips on a bottom one of sheets with each of said strips extending from a top surface of said bottom sheet and around an end edge and onto a bottom surface of said bottom sheet, and each strip being connected to a corresponding one of said vias;

a metallized conductive layer over substantially all surface areas of said substrate, except for a central portion of said substrate top area and exposed portions of said conductive strips, said conductive layer thus providing a ground plane for said filter circuit and a unitary second plate for each of said filter capacitors and a portion of an electromagnetic and radiofrequency interference shield for said filter circuit;

small conductive lands screened onto said central portion and separate from said ground plane to provide a corresponding individual first plate for each said filter capacitor;

discrete air core inductors, commensurate with characteristics of said filter circuit, attached between said ground plane and corresponding ones of said first plates and in order to provide a plurality of filter sections;

means for interconnecting said filter sections and said vias in order to complete said filter circuit as a surface mountable-type chip with input and output paths from said filter circuit to said surface mounting lead portions of said strips on said substrate bottom area; and a metallic can attached to said ground plane and spaced from and covering said inductors, thus completing said interference shield for said circuit while providing a physical shield for said inductors and providing a uniform profile adapted for subsequent handling of said chip.

5. In a surface mount-type chip providing a filter circuit having lands screened onto a dielectric substrate as first plates of filter capacitors, and discrete air core inductors attached thereto for said filter, the improvement comprising:

a metallic coating on substantially all surface areas of said substrate, except for a central top portion of said substrate containing said lands and exposed portions of vias from said central top portion to surface mounting lead portions on a bottom of said substrate, said coating providing a second plate for said capacitors and a ground plane for said circuit and a portion of an EMI and RFI shield for said circuit; and a formed metallic cover attached to said ground plane and spaced from and covering said inductors and lands, said cover providing a remainder of said EMI and RFI shield, while providing a physical shield for said inductors, and a solid, uniform profile adapted for subsequent handling by a pick and place component handling head.

* * * * *